(12) United States Patent
Krishnamoorthy et al.

(10) Patent No.: US 8,325,773 B2
(45) Date of Patent: Dec. 4, 2012

(54) STRUCTURES AND METHODS FOR ADJUSTING THE WAVELENGTHS OF LASERS VIA TEMPERATURE CONTROL

(75) Inventors: Ashok V. Krishnamoorthy, San Diego, CA (US); John E. Cunningham, San Diego, CA (US); Bruce M. Guenin, San Diego, CA (US); Howard L. Davidson, San Carlos, CA (US)

(73) Assignee: Oracle America, Inc., Redwood Shores, CA (US)

( * ) Notice: Subject to any disclaimer, the term of this patent is extended or adjusted under 35 U.S.C. 154(b) by 0 days.

(21) Appl. No.: 13/326,297

(22) Filed: Dec. 14, 2011

(65) Prior Publication Data
US 2012/0093184 A1 Apr. 19, 2012

Related U.S. Application Data

(63) Continuation of application No. 11/485,594, filed on Jul. 12, 2006, now Pat. No. 8,089,995.

(51) Int. Cl.
*H01S 3/04* (2006.01)
(52) U.S. Cl. ......... 372/36; 372/35; 372/34; 372/50.121; 372/50.12; 372/50.11
(58) Field of Classification Search ............ 372/36, 372/35, 34, 50.121, 50.12, 50.11
See application file for complete search history.

(56) References Cited

U.S. PATENT DOCUMENTS

| | | | |
|---|---|---|---|
| 8,089,995 B2 * | 1/2012 | Krishnamoorthy et al. | 372/36 |
| 2002/0009258 A1 | 1/2002 | Coldren et al. | |
| 2002/0090011 A1 * | 7/2002 | Pezeshki et al. | 372/20 |
| 2008/0278565 A1 * | 11/2008 | Marsh et al. | 347/237 |

OTHER PUBLICATIONS

Lemoff et al., "Maui: Enabling Fiber-to-the-Processor with Parallel Multiwavelength Optical Interconnects", Journal of Lightwave Technology, vol. 22, No. 9, Sep. 2004, pp. 2043-2053.
Lemoff et al., "Parallel-WDM for Multi-TB/S Optical Interconnects", Agilent Technologies Laboratories, 2005 IEEE, 0-7803-9217, pp. 359-360.
Shakouri et al. "On-chip Solid-state Cooling for Integrated Circuits Using Thin-film Microrefrigerators", IEEE Transactions on Components and Packaging Technologies, vol. 28, No. 1, Mar. 2005, pp. 65-69.

* cited by examiner

*Primary Examiner* — Kinam Park
(74) *Attorney, Agent, or Firm* — Park, Vaughan, Fleming & Dowler LLP; Anthony P. Jones

(57) ABSTRACT

One embodiment of the present invention provides a system that facilitates adjusting the wavelengths of lasers via temperature control. This system includes a chip with an active face upon which active circuitry and signal pads reside. A thermal-control mechanism provides localized thermal control of two lasers mounted upon the active face of the chip. By individually controlling the temperature of the lasers, the thermal-control mechanism controls the wavelengths emitted by each respective laser. By creating a temperature gradient that causes a temperature difference between two or more lasers, the system can cause the lasers to emit different wavelengths.

12 Claims, 3 Drawing Sheets

STRUCTURES AND METHODS FOR ADJUSTING THE WAVELENGTHS OF LASERS VIA TEMPERATURE CONTROL

RELATED APPLICATIONS

This application is a continuation of, and hereby claims priority under 35 U.S.C. §120 to, pending U.S. patent application Ser. No. 11/485,594, entitled "Structures and Methods for Adjusting the Wavelengths of Lasers via Temperature Control" by inventors Ashok V. Krishnamoorthy, John E. Cunningham, Bruce M. Guenin, and Howard L. Davidson, filed on 12 Jul. 2006, which is incorporated by reference herein.

BACKGROUND

1. Field of the Invention

The present invention generally relates to semiconductor lasers and integrated circuits. More specifically, the present invention relates to structures and methods for adjusting the wavelength of a laser via temperature control.

2. Related Art

Optical communication techniques offer high-bandwidth communication over long distances. Advantages over electrical cabling include exceptionally-low data-loss rates that allow long distances between amplifiers, high data-carrying capacity, and no crosstalk between fiber cables. However, since electrical VLSI circuits are typically used for processing information, using optical interconnects typically involves performing electrical-to-optical and optical-to-electrical conversion operations. Techniques for delivering data to optical components and breaking conversion bottlenecks become important, particularly if the photonics and electronics are not tightly-integrated.

Electrical bottlenecks between optoelectronic driver/receiver circuits and photonic devices have led to the development of mechanisms that facilitate tight integration between optics and electronics on VLSI circuits. However, a second bandwidth-density bottleneck arises in the optical interface when each fiber carries a single channel of data, and a large number of fibers carrying high-speed data channels need to be coupled to a given optoelectronic integrated circuit.

Different methods for multiplexing multiple channels into a single optical fiber exist, such as wavelength-division multiplexing (WDM), which allows each fiber to communicate multiple channels of information simultaneously. WDM overcomes fiber congestion problems and reduces the number of fibers that need to access a module, which simplifies connection and miniaturization efforts. However, fabricating and integrating a set of precisely-tuned lasers with appropriately-spaced wavelengths into a package solution for dense WDM remains challenging and costly in typical manufacturing processes, because of the fine tolerances involved in densely-integrating a set of laser signals into the thermal environment of a chip.

Hence, what is needed are structures and methods for enabling dense WDM without the above-described problems.

SUMMARY

One embodiment of the present invention provides a system that facilitates adjusting the wavelengths of lasers via temperature control. This system includes a chip with an active face upon which active circuitry and signal pads reside. A thermal-control mechanism provides localized thermal control of two lasers mounted upon the active face of the chip. By individually controlling the temperature of the lasers, the thermal-control mechanism controls the wavelengths emitted by each respective laser. By creating a temperature gradient that causes a temperature difference between two or more lasers, the system can cause the lasers to emit different wavelengths.

In a variation on this embodiment, the thermal-control mechanism includes a heating and/or cooling element that controls the temperature of a region on the chip. Efficient heat-conducting channels allow the efficient transfer of heat between one or more of the lasers and this region on the chip, thereby allowing the temperature of the laser(s) to be controlled.

In a variation on this embodiment, the thermal-control mechanism includes a heating element located on or in close proximity to one or more of the lasers. This heating element uses resistive and/or active heating to control the temperature of the laser.

In a variation on this embodiment, one of the lasers is a vertical-cavity surface-emitting laser.

In a variation on this embodiment, the lasers are part of an array of lasers fabricated upon the active face of the chip. In this embodiment, the thermal-control mechanism is configured to create a temperature gradient across the array of lasers to provide localized, individualized thermal control for the lasers, thereby causing the lasers in the array of lasers to emit different wavelengths.

In a further variation, the lasers in the array emit different, spaced wavelengths that are combined to generate a dense wavelength-division-multiplexed signal that accommodates a large number of communication channels within a given wavelength band.

In a further variation, the array of lasers includes a spare laser. The thermal-control mechanism can adjust the wavelength of the spare laser to substitute the spare laser for any other laser in the array of lasers, thereby improving system reliability.

In a variation on this embodiment, the thermal-control mechanism monitors, controls, and stabilizes the temperature and wavelength of a laser.

In a variation on this embodiment, the thermal-control mechanism minimizes the total amount of heat needed for controlling the wavelength of a laser.

In a variation of this embodiment, a laser is mounted to the chip either by fabricating the laser on the active face of the chip or by bonding the laser to the active face of the chip.

DETAILED DESCRIPTION

Figure 1:
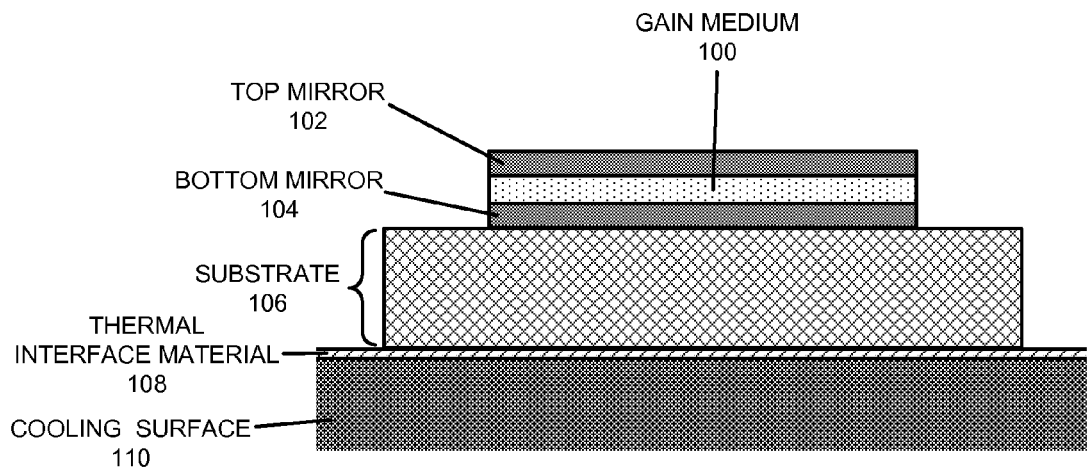
FIG. 1 illustrates a vertical-cavity surface-emitting laser (VCSEL) in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Optical Networking and Wave-Division Multiplexing

Parallel optical communication is becoming increasingly common in board-to-board, rack-to-rack, and box-to-box interconnect applications. For example, in one sample application, optical transceivers provide an aggregate capacity of 10-40 Gigabits per second, with each transceiver providing one, four, or twelve channels arranged in one-dimensional 1×12 arrays in which each channel is carried on a separate fiber. Other products with higher bandwidths may be based on two-dimensional arrays of optical lasers and detectors. However, major improvements are still needed in cost-performance, and also in bandwidth-density, compared to the input/output bandwidth achievable in a given unit area or volume.

As the use of optical communication techniques continues to grow in global, inter-state, metro, campus, and even intra-building or central-office applications, the associated data processing in electrical circuits causes optical-to-electrical and electrical-to-optical conversion bottlenecks. Such conversion bottlenecks have led to the integration of photonic devices with electronics, for instance by including detectors, modulators, LEDs (light-emitting diodes), and vertical-cavity surface-emitting lasers (VCSELs) onto VLSI circuits.

However, the optical interface can present a bandwidth-density bottleneck. If each fiber carries a single channel of data, then the number of fibers coupled to a given optoelectronic integrated circuit scales linearly with the number of data channels connected to the integrated circuit. Wavelength-division multiplexing (WDM) and other multiplexing techniques can overcome this limitation by multiplexing multiple data channels into a single fiber, thereby significantly increasing the bandwidth-density product of the optical transmission. By reducing the number of fibers that need to access a module, WDM simplifies the connections for miniaturized VCSEL-based parallel optical transceivers.

Several variations of WDM exist. Dense WDM (DWDM), which is typically used in high-performance systems, uses narrow wavelength spacing. Systems typically achieve DWDM by modulating data directly onto a highly-stable optical carrier and then combining such carriers into the fiber. Traditional time-division multiplexing techniques may be used to bring data up to a suitable transmission rate. DWDM accommodates a large number of channels within a given wavelength band, and has a further advantage that, for short-distance links (e.g. <100 meters), the timing skew of channels is negligible compared to the bit-period, even at bit-rates such as 20 Gbps. This negligible skew allows accurate timing between the multiple DWDM channels, even after transmission through the fiber. By encoding one bit per wavelength, a system using DWDM can improve the delay characteristics of the channel by removing or reducing serialization delay. Bit-per-wavelength encoding can also provide a more secure channel by protecting against wavelength tapping in the fiber.

Unfortunately, multi-wavelength lasers and other optical components needed to create, combine, and separate wavelengths for WDM can often be costly. Typical low-cost optical interconnection techniques do not incorporate WDM, but instead use arrays of VCSELs fabricated on a single chip, with each of the VCSELs lasing into a separate fiber at approximately identical wavelengths and an equivalent receiver array at the receiving side of the link. Some lower-cost applications with larger source line-widths and larger, temperature-dependent wavelength drifts use coarse WDM (CWDM). These CWDM solutions also use low-cost VCSELs, but typically combine only a small number of optical channels, and do not provide the same level of reduction in the number of fibers as DWDM. Additionally, such systems typically use discrete VCSEL devices, which involve an individualized, costly bonding or fabrication process. In general, creating an integrated, dense, two-dimensional array from discrete VCSELS can be difficult, and the resulting CWDM solutions typically do not offer the desired benefits of DWDM.

The present invention obtains the performance advantages achievable with DVDM, but by using arrays of thermally-controlled VCSELs that do not incur the cost penalties associated with typical DWDM components.

Effects of Temperature Chance on VCSELs

A laser is essentially an optical cavity with a gain medium, in which photons are amplified into a coherent, near-monochromatic beam. A Fabry-Perot (FP) laser comprises a laser oscillator in which two reflective surfaces are separated by the amplifying gain medium with an inverted population. The length of the gain media sets the length of the FP cavity, which serves as a resonator. Light bouncing within this resonator is amplified by the gain medium, with the size of the cavity determining the laser's wavelength.

FIG. 1 illustrates a VCSEL laser, in which a gain medium 100 is sandwiched between a top mirror 102 and a bottom mirror 104, and the laser assembly is mounted on top of a substrate 106. A large number of lasers, modulators, and detectors can be individually attached via flip-chip solder-bump bonding to the surface of a silicon CMOS VLSI chip. Such attachments can achieve a low thermal resistance between the laser and the underlying silicon circuit. The substrate 106 may in turn be in intimate contact with a cooling surface 110 that forms part of a heat exchange system. A low thermal resistance between components allows the heat exchange system to transfer heat from the laser and/or substrate to the cooling surface 110. A thermal interface material (TIM) 108 between the substrate 106 and cooling surface 110 can further reduce the thermal resistance, thereby improving heat transfer from the substrate and/or the laser to the cooling plate below. Furthermore, the TIM enhances the spatial uniformity in the heat transfer between the substrate and the cooling plate.

Typical laser manufacturing processes typically strive to reduce the variation in laser wavelength for lasers manufactured on a single wafer. Hence, manufacturing lasers with small, controlled variations in magnitude, especially VCSELs, presents substantial difficulties. In particular, growing a gain medium at an angle with uniform atomic precision during the manufacturing process involves significant challenges. An alternate approach, in which an array of VCSEL lasers are gathered from wafer batches (or "bins") manufactured for different wavelengths, involves mounting the individual lasers onto the chip in discrete steps, and typically involves a substantially larger difference in wavelength more suitable for CWDM than DWDM. These approaches do not provide compact, integrated solutions that enable large arrays of VCSELs to be integrated with circuits for DWDM.

The size of a laser's FP cavity, and the corresponding wavelength of the light emitted, can be affected by the temperature of the lasing junction of the device. Increasing the temperature in the immediate vicinity of the laser causes thermal expansion of the cavity, thereby lengthening the wavelength of the laser. For instance, the wavelength of some VCSEL lasers may change by 0.1 to 0.4 nm for each additional Celsius degree of temperature. Note that while an increased temperature can also change the index of refraction for the gain medium, thereby causing an additional change in wavelength either beyond or counter to the wavelength change provided by the temperature change, the temperature change causes the predominant change in laser wavelength. Note that proper placement of the FP wavelength with respect to the gain curve allows the laser to be tuned with little or no variation in output power.

Figure 2:
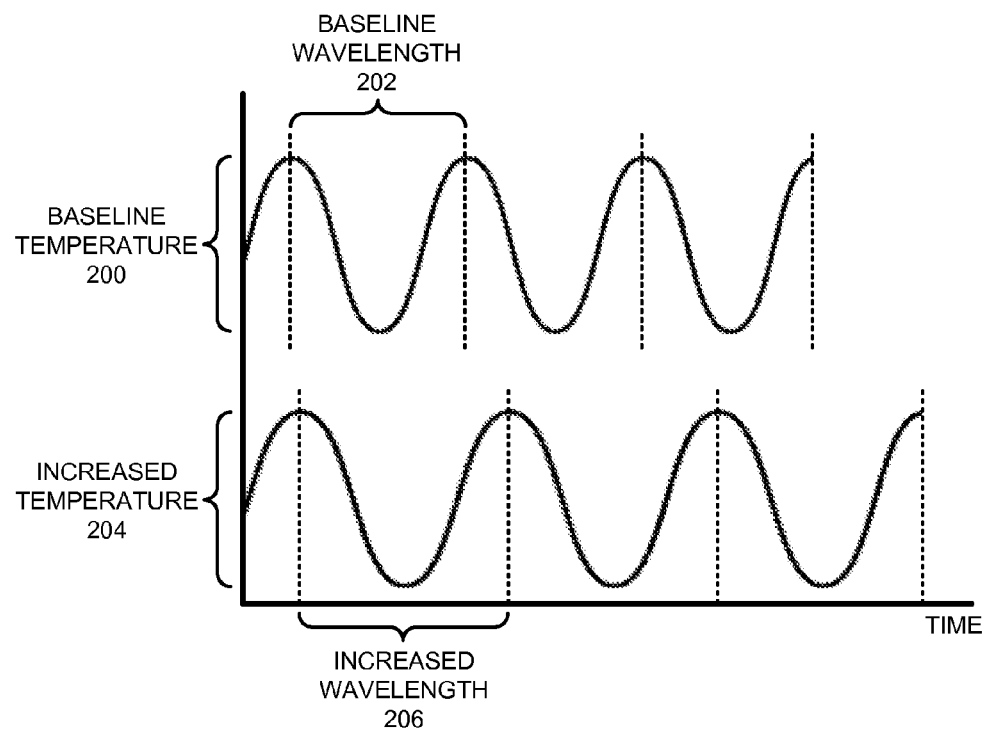
FIG. 2 illustrates a change in laser wavelength in response to increased temperature in the vicinity of the laser in accordance with an embodiment of the present invention.

FIG. 2. illustrates a change in laser wavelength in response to increased temperature in the vicinity of a laser. Initially, the laser operates at a baseline temperature 200, and emits photons at a baseline wavelength 202. When the temperature in the vicinity of the laser is increased 204, the photons emitted by the laser increase in wavelength 206.

By controlling the temperature individually for a set of VCSELs with a substantially similar baseline wavelength, the system can employ a uniform, inexpensive set of lasers yet still create wavelength spacing appropriate for DWDM. Temperature-controlled WDM generation can be used to maintain wavelength spacing in such a laser array, if the system can maintain a constant (or pre-determined) temperature gradient in spite of chip-level or environmental temperature perturbations.

In one embodiment of the present invention, the wavelength spacing between lasers in DWDM ranges between one and two nanometers. Depending on factors such as the gain medium, such ranges may lead to a wide temperature range in the VCSELs. For instance, if the wavelength of each VCSEL changes by 0.25 nm per degree Celsius, ten lasers are used, and the maximum wavelength range spans 10 nm, the resulting temperature range would be on the order of 40 degrees Celsius. Reducing the spacing between lasers to 0.5 nm for a total range of roughly 5 nm reduces this temperature range, and thereby increasing the reliability of the VCSELs, but may also cause issues with signal overlap and a need for very fine temperature control. In general, providing such fine-grained heat control involves significant challenges.

Heating Elements to Adjust Temperature and Wavelength

Creating and maintaining a temperature gradient for an array of lasers can present a substantial challenge. In certain operating conditions, the absolute wavelength range of the array may experience drift, for instance if the ambient temperature changes or because of a global change in the temperature of a silicon chip's substrate. The system can use active thermal management to produce and maintain correct spacing between the wavelengths of the lasers as long as the chip does not experience thermal runaway and the temperature dependence of the laser wavelengths remains in the linear region.

In one embodiment of the present invention, active cooling, such as a cooled surface maintained at a constant temperature, may be used to control and maintain a silicon chip substrate at a pre-determined level, from which individual lasers are heated to a desired operating temperature. In this technique, called "bias heating," the system ensures that when the ambient temperature is at a maximum rated temperature and all devices are fully-powered, the temperature of each device will be less than the temperature needed for a desired wavelength.

Bias heating follows the principle that local heating is typically cheap and compact, while local cooling, for instance via local refrigeration, is much more difficult to achieve. Hence, this technique provisions the cooling system to provide "global cooling" for the worst-case thermal situation, and then uses heating elements to provide local heating that adjusts temperatures and wavelengths as needed. A heat exchanger may be used to transfer heat from a laser and/or chip to either a flowing liquid or air, and may include a thermo-electric-cooler (TEC). Bias heating can be used to compensate for temperature changes in the heat exchanger. Alternatively, the cooling surface may provide temperature-control using: a liquid-cooled heat exchanger with a temperature-controlled liquid; a TEC in combination with a liquid-cooled heat exchanger with nominal temperature control of the liquid; and/or a TEC in combination with an air-cooled heat exchanger (or heat sink). Such cooling systems might be in contact with the substrate or intimately integrated with a laser and/or chip. For instance, in addition to being a separate component, the TEC might be integrated with the substrate, or a liquid-cooled heat exchanger may be integrated into the substrate using micro-channels etched into the silicon.

Note that once the temperature of the system is low enough that reliable biased heating can be achieved with all of the VCSELs, operating at lower temperatures serves merely to increase the total thermal dissipation generated by the device. Note also that bias heating can be used to dynamically compensate for temperature changes due to other circuits on the chip.

Heating elements may be placed in a variety of configurations to maintain the delicate heat balance between the substrate and the individual lasers. For instance, a set of heating elements can create a temperature gradient across a laser array directly. Alternatively, a set of heating elements can create a gradient in an underlying silicon circuit that then transfers the temperature gradient from the circuit into the laser array via a heat-conducting channel. In another embodiment, localized heating can be fabricated both on top of each VCSEL as well as on the silicon circuit during the silicon foundry process. Note that such heating elements may include both resistive heating elements as well as active heating elements.

In one embodiment of the present invention, the system uses heating elements to adjust the temperatures and wavelengths of lasers in a DWDM VCSEL array. In this embodiment, an integrated CMOS-VCSEL chip is comprised of a bottom-emitting VCSEL array created using a standard VCSEL manufacturing platform that is bonded to a silicon circuit with VCSEL drivers fabricated in a standard CMOS or other foundry process. This system may include heating elements localized to individual VCSELs whose function is to individually heat the VCSELs. These heating elements maintain a specific, intended temperature difference between the junctions of the VCSELs in the array, thereby causing a specific, intended wavelength difference between the lasing wavelengths in the array.

Figure 3A:
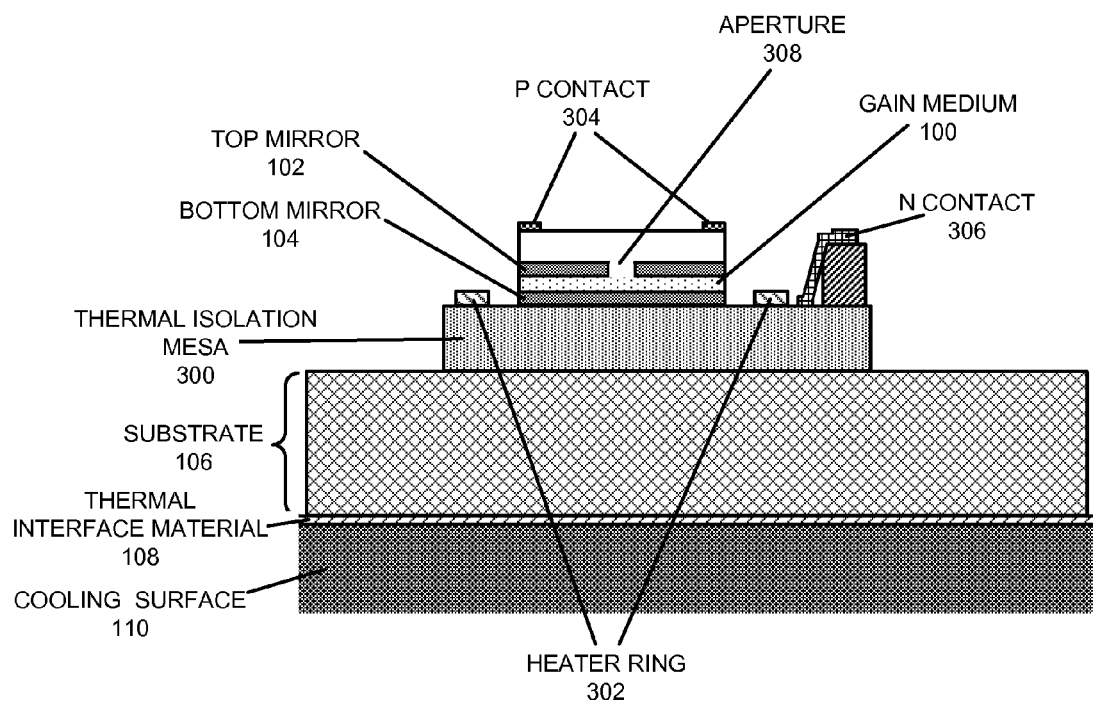
FIG. 3A illustrates a side view of a VCSEL structure with heating elements integrated in proximity to the VCSEL in accordance with an embodiment of the present invention.

FIG. 3A illustrates a side view of a VCSEL structure with heating elements integrated in proximity to the VCSEL. In FIG. 3A, a VCSEL is mounted on top of a thermal isolation mesa 300, which thermally insulates the VCSEL from neighboring lasers and other heat effects. This thermal isolation mesa 300 is in turn mounted on top of a substrate 106. Heating elements, in the form of a heater ring 302, are integrated into the mesa structure surrounding the VCSEL. A controlled amount of current can be sourced from a CMOS chip into this heater ring 302 to adjust the temperature of the VCSEL. FIG. 3A also illustrates the P contact 304 and the N contact 306 of the VCSEL's lasing junction, along with the aperture 308.

Figure 3B:
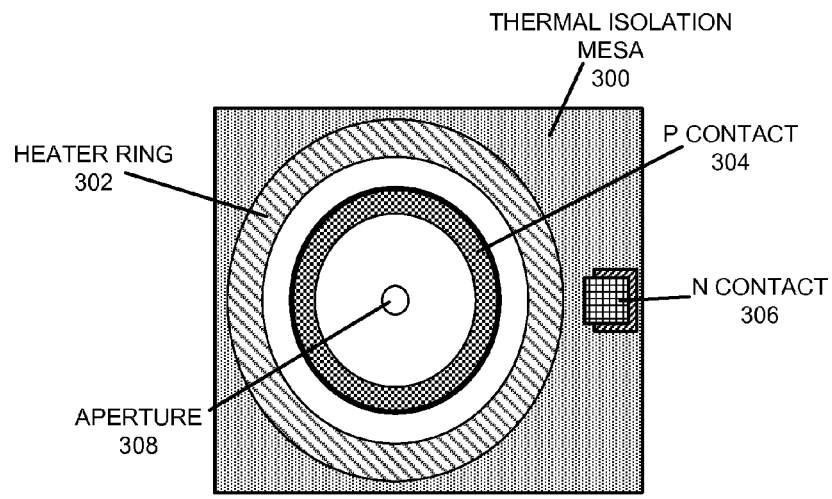
FIG. 3B illustrates a top view of a VCSEL structure with heating elements integrated in proximity to the VCSEL in accordance with an embodiment of the present invention.

FIG. 3B illustrates a top view of the VCSEL structure and the thermal isolation mesa 300.

In one embodiment of the present invention, the system uses heating elements on the silicon circuit and efficiently transfers heat to the individual lasers using a bond between the laser and the underlying silicon substrate. These heating elements may consist of active transistor structures, passive resistor structures, or a combination of the two, with the resistor structures typically fabricated from doped silicon or metal. If a laser array is bonded to a silicon chip, the metallic flip-chip bumps used to inject current into the device can also be used to conduct heat from the chip to the laser elements. Alternatively, additional bumps between the VCSEL array and the silicon chips can be used to conduct either current or heat between the chips. Such bumps can be designed with very low resistance and very small diameter to efficiently conduct current as well as to accurately and precisely convey the temperature profile from the silicon heater chip to the VCSEL array. Such efficient heat transfer can provide a precise thermal gradient across the array, thereby enabling a corresponding wavelength gradient.

Figure 4A:
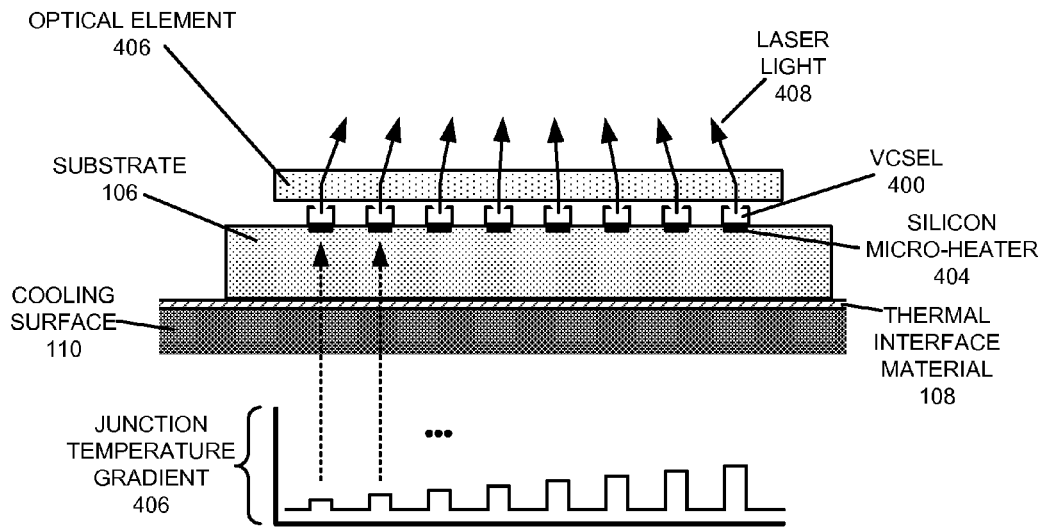
FIG. 4A illustrates a VCSEL array mounted on a substrate that includes heating elements in accordance with an embodiment of the present invention.

FIG. 4A illustrates a VCSEL array mounted on a silicon substrate 106 that includes current-controlled heating elements. Each VCSEL 400 is conductively connected via micro-bumps 402 to a substrate 106 that includes silicon micro-heater elements 404. Heat transfers from these heating elements via the micro-bumps 402 to the VCSEL array, thereby allowing the junction temperature gradient 406 to be transferred to the array and tuning the temperature of each individual VCSEL. An optical element 408 can direct emitted laser light 410, for instance into an optical fiber.

Figure 4B:
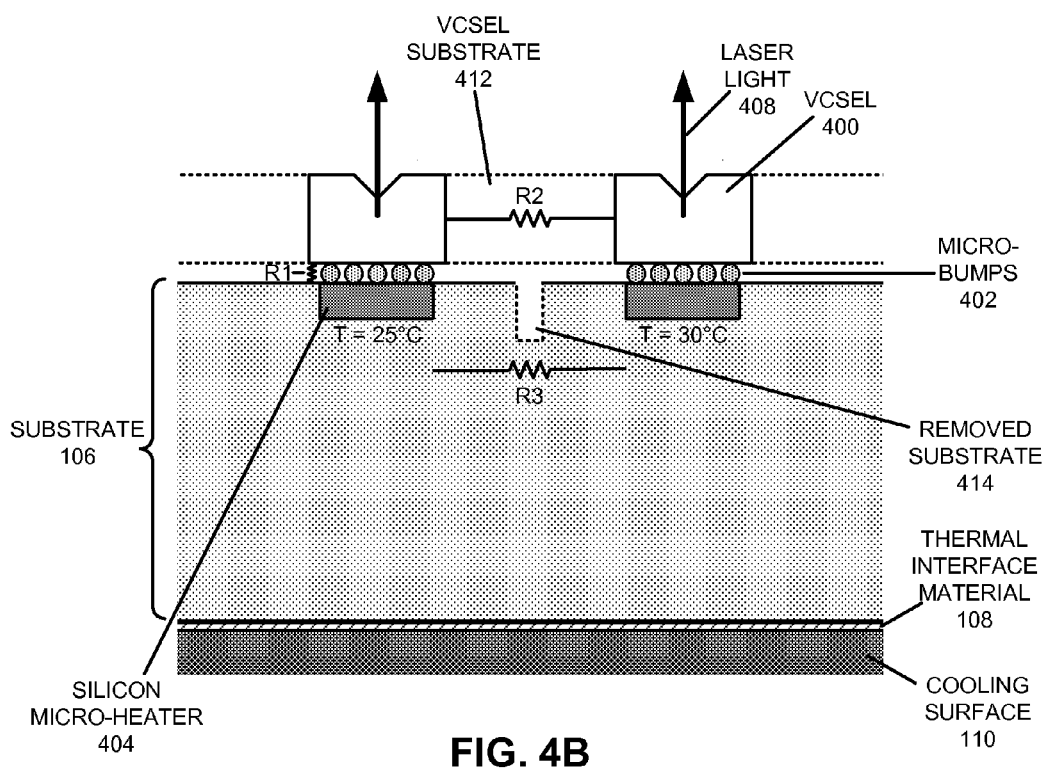
FIG. 4B illustrates a portion of a VCSEL array mounted on a substrate in greater detail in accordance with an embodiment of the present invention.

FIG. 4B illustrates a portion of the VCSEL array in greater detail. One challenge with integrated silicon micro-heaters is isolating the heat to a desired region that transfers the heat faithfully to a VCSEL but does change the heat profile of surrounding VCSELs. For instance, in FIG. 4B, while a very low thermal impedance R1 allows heat to transfer efficiently from the silicon micro-heater 404 to the VCSEL 400, very high thermal impedances R2 and R3 in the VCSEL substrate 412 and silicon substrate 106, respectively, can prevent heat from flowing from one VCSEL to neighboring areas. Depending on the desired R2 thermal impedance, the VCSEL substrate 412 around the VCSELs (as indicated in FIG. 4B by the dotted lines), which may include a much greater thermal impedance than the silicon substrate 106, can be left in place, thinned, or removed completely. Similarly, attempts to reduce R3 may involve trenching or removing a portion of the silicon substrate 414 to restrict heat flow. Such techniques achieve effects substantially similar to the thermal isolation mesa 300 shown in the VCSEL heated using proximity heating, with a similar goal of providing a measure of thermal isolation that reduces the power needed to achieve a desired biased temperature control. Note that if good thermal conduction allows heat to transfer too easily between neighboring VCSELs, the system will not be able to maintain a temperature difference, and therefore fail to achieve wavelength spacing. Because electrical conductors are often also good conductors of heat, the system needs to be carefully balanced both electrically and thermally to provide a suitable wavelength gradient.

Applications and System Monitoring

In one embodiment of the present invention, commercial VCSELs in arrays of a substantially single wavelength type use localized thermal control of individual wavelengths to create a DWDM VCSEL array. The modulated light emitted by such VCSELS can then be used to transmit data, for instance by using refraction or a diffraction grating to direct the emitted outputs into an optical fiber.

In one embodiment of the present invention, the system also includes a monitoring, control, and stabilization systems that ensure that the desired wavelengths are achieved. Towards this end, the system may monitor temperature, wavelength, light output, and other factors. Monitoring systems may include temperature-sensitive devices, such as a diode in which current flow depends on temperature, a bandgap detector used to measure wavelength, and/or a photodetector used to monitor power. In a further embodiment, the system may monitor multiple wavelengths and attempt to make them substantially similar. For instance, the system may maintain one or more "spare lasers," so that in case of laser weakness or failure, the system can temperature-tune a spare laser to the wavelength corresponding to the failing laser.

In one embodiment of the present invention, the WDM laser array couples into waveguides inside a chip. For instance, the laser may point down into the chip, and the surface of the chip may include a grating coupler that assists in getting light into the chip. This technique might be used, for instance, to route light to and power a set of modulators that are used for inter-chip communication. In this variation, the system may emit light into a modulator. Electrical signals applied to the modulator create amplitude modulation. This modulated signal may then be guided elsewhere on the same or another chip.

In one embodiment of the present invention, mounting a laser such as a VCSEL can involve bonding a laser to a chip and/or fabricating parts or all of the laser directly on the chip.

In summary, by using biased heating, a mechanism for controlling the temperature of laser junctions using either localized heaters in proximity to lasers or heat generated in a circuit substrate together with global cooling of the substrate, the system in one embodiment of the present invention can:

Achieve desired local temperature control and controlled temperature gradients across a chip using standard and inexpensive circuits, materials, and components and a simple assembly process;

Create a DWDM wavelength gradient from low-cost laser components, such as VCSELs, while minimizing the total amount of heat needed for biased temperature control;

Achieve a dense level of DWDM that fits many wavelengths into a smaller number of optical fibers, thereby reducing fiber congestion and simplifying fiber routing;

Adjust WDM grid spacing depending on the platform and need, and gain further benefits as technology trends enable increasingly smaller bandwidth intervals that allow smaller temperature differences between laser junctions in future systems;

Allow areal density with WDM to not be limited by fiber connector density; and/or Enable channel sparing to improve system reliability.

Hence, designing VCSELs and localized heating techniques that enable temperature gradients and temperature-controlled WDM provide substantial benefits for optical communication.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclo-

What is claimed is:

1. A system for adjusting wavelengths of light emitted from laser elements via temperature control, comprising:
   a substrate;
   a first laser element coupled to the substrate;
   a second laser element coupled to the substrate;
   a thermal-isolation mechanism, wherein the thermal-isolation mechanism is coupled to the substrate between the first laser element and the second laser element;
   wherein the thermal-isolation mechanism thermally insulates the first laser element from the second laser element and facilitates changing a temperature of one of the first and second laser elements while restricting a flow of heat to or from the other of the first and second laser elements to limit a change in temperature of the other of the laser elements that is caused by changing the temperature of the laser element; and
   a thermal-control mechanism that creates a temperature difference between the first laser element and the second laser element, thereby configuring the first laser element and the second laser element to emit different wavelengths of light.

2. The system of claim 1, wherein the thermal-control mechanism further comprises at least one temperature-control element comprising at least one of a heater or a cooler coupled on or in close proximity to a corresponding laser element, and configured to change a temperature of the laser element.

3. The system of claim 2, wherein the temperature-control element comprises at least one of resistive or active heating elements.

4. The system of claim 2, further comprising:
   one or more additional laser elements coupled to the substrate, wherein a combination of the first laser element, the second laser element, and the additional laser elements forms an array of laser elements; and
   zero or more corresponding thermal-isolation mechanisms coupled to the substrate between each of the additional laser elements and the other laser elements in the array of laser elements;
   wherein the thermal-control mechanism comprises zero or more temperature-control elements configured as at least one of a heater or a cooler coupled on or in close proximity to each of the additional laser elements; and
   wherein the thermal-control mechanism is configured to use corresponding temperature-control elements to change a temperature of one or more of the laser elements in the array of laser elements to create a temperature gradient across the array of laser elements, thereby providing localized, individualized thermal control for the laser elements in the array of laser elements and causing one or more laser elements in the array of laser elements to emit a different wavelength of light than one or more other laser elements in the array of laser elements.

5. The system of claim 1, further comprising a combining mechanism configured to combine the different wavelengths of light emitted from the laser elements in the array of laser elements to generate a dense wavelength-division-multiplexed signal.

6. The system of claim 5, wherein at least one of the laser elements in the array of laser elements is configured as a spare laser element, wherein the thermal-control mechanism is configured to:
   adjust a temperature for the spare laser element to adjust the wavelength of light emitted from the spare laser element to match a wavelength of light emitted by another laser element in the array of laser elements; and
   substitute the spare laser element for the other laser element to improve system reliability.

7. The system of claim 1, wherein the thermal-control mechanism is further configured to monitor, control, and stabilize a temperature and a wavelength of light emitted from the laser elements.

8. The system of claim 1, wherein the thermal-control mechanism is further configured to minimize the total amount of heat needed for controlling the wavelength of light emitted from the first laser element and the second laser element.

9. The system of claim 1, wherein the first laser element and the second laser element are coupled to the substrate or to a corresponding thermal isolation mechanism by at least one of:
   fabricating the laser element on the substrate or the corresponding thermal isolation mechanism; or
   bonding the laser element to the substrate or the corresponding thermal isolation mechanism.

10. The system of claim 1, further comprising:
   a cooling surface coupled to the substrate, wherein the cooling surface is configured to draw heat from the substrate to configure a temperature of at least one of the first laser element or the second laser element so that a corresponding desired wavelength of light is emitted from the laser element.

11. The system of claim 1, wherein the thermal-control mechanism is configured to use bias heating to change the temperature of at least one of the first laser element and the second laser element.

12. The system of claim 1, wherein the thermal-isolation mechanism comprises a thermal isolation mesa.

* * * * *